United States Patent
Saito

(10) Patent No.: US 6,490,441 B1
(45) Date of Patent: Dec. 3, 2002

(54) TUNING CIRCUIT DEVICE WITH BUILT-IN BAND PASS INTEGRATED ON SEMICONDUCTOR SUBSTRATE TOGETHER WITH PLL CIRCUIT

(75) Inventor: Hitoshi Saito, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/553,893

(22) Filed: Apr. 20, 2000

(30) Foreign Application Priority Data

Apr. 21, 1999 (JP) .......................................... 11-113714

(51) Int. Cl.[7] ................................................. H04B 1/18
(52) U.S. Cl. ................................ 455/183.1; 455/193.3; 455/307; 455/318
(58) Field of Search .......................... 455/180.1, 180.3, 455/183.1, 190.1, 190.3, 193.1, 193.2, 193.3, 260, 307, 317, 328, 339; 348/725, 729, 728, 731, 735

(56) References Cited

U.S. PATENT DOCUMENTS 6,052,071 A * 4/2000 Mishima et al. ............ 455/318
6,177,964 B1 * 1/2001 Birleson et al. ............ 348/725

FOREIGN PATENT DOCUMENTS

| JP | 60-223335 | 11/1985 |
|----|-----------|---------|
| JP | 04-329018 | 11/1992 |
| JP | 5-218894  | 8/1993  |
| JP | 06-152450 | 5/1994  |
| JP | 06-188689 | 7/1994  |
| JP | 09-008687 | 1/1997  |
| JP | 11-112894 | 4/1999  |

* cited by examiner

Primary Examiner—Thanh Cong Le
(74) Attorney, Agent, or Firm—Katten Muchin Zavis Rosenman

(57) ABSTRACT

An analog tuning circuit, a phase locked loop and a controller form a semiconductor integrated tuning device, and the analog tuning circuit has a variable band pass filter between a mixer and an amplifier so as to match an intermediate frequency signal to a telecasting facility standard, wherein the controller supplies control signals produced on the basis of an external instruction to the variable band pass filter so that the semiconductor integrated tuning device is shareable between the products exported to difference countries.

11 Claims, 4 Drawing Sheets

TUNING CIRCUIT DEVICE WITH BUILT-IN BAND PASS INTEGRATED ON SEMICONDUCTOR SUBSTRATE TOGETHER WITH PLL CIRCUIT

FIELD OF THE INVENTION

This invention relates to a semiconductor integrated tuning circuit device and, more particularly, to a semiconductor integrated tuning circuit device with a built-in phase locked loop.

DESCRIPTION OF THE RELATED ART

A typical example of the receiver converts a high-frequency broadcasting signal through a mixer to an intermediate frequency signal. A prior art tuner incorporated in the AM/FM receiver is disclosed in Japanese Patent Publication of Unexamined Application No. 60-223335. The prior art tuner includes a band pass filter in the AM intermediate frequency circuit, and the band pass filter is implemented by a switched capacitor circuit. The switched capacitor circuit requires a clock signal. A PLL (Phase Locked Loop) synthesizer has a reference frequency oscillator, and the clock signal is generated on the basis of the output signal the reference frequency oscillator. The intermediate frequency signal of the AM receiver is as low as 455 kHz. If an LCR network is used as the band pass filter for the intermediate frequency signal, the LCR network occupies wide area on a semiconductor substrate, and such a large-sized LCR network is undesirable. For this reason, the switched capacitor circuit is used as the band pass filter.

The Japanese Patent Publication of Unexamined Application teaches that the clock signal is generated on the basis of the output signal of the PLL synthesizer. The prescaler reduces the frequency fref of the reference frequency signal, and produces an output signal. The output signal has the frequency equal to a submultiple fref/P of the reference frequency signal fref. The output frequency signal fref/P is supplied to a phase comparator. On the other hand, a local oscillator supplies an oscillating signal fA to a programmable frequency divider, and the programmable frequency divider reduces the frequency of the oscillating signal fA. The output signal of the programmable frequency divider has the frequency equal to a submultiple fA/Q of the frequency of the oscillating signal fA. The output signal fA/Q is also supplied to the phase comparator, and the phase comparator compares the output signal fref/P with the output signal fA/Q to see whether or not both signal are equal in frequency to each other. The output signal of the phase comparator is representative of the difference of the frequency between the output signals fref/P and fA/Q. The phase comparator supplies the output signal thereof through a low pass filter to the local oscillator. The local oscillator is responsive to the output signal of the phase comparator so as to vary the frequency of the oscillating signal fA. Thus, the oscillating signal fA follows the reference frequency signal fref.

Another prior art tuner is disclosed in Japanese Patent Publication of Unexamined Application No. 5-218894. The prior art tuner is operative in the VHF (Very High Frequency)/UHF (Ultra High Frequency) bands. The intermediate signals are produced from the broadcasting signal of a broadcasting satellite and the communicating signal of a communication satellite, and an AM modulation system is employed in the prior art tuner. The prior art receiver receives the broadcasting signal at 27 MHz, and the intermediate frequency signal is converted to a cable-television signal at 6 MHz and a high-vision signal at 12 MHz. In order to respond to the plural intermediate frequencies different in pass band, the prior art tuner includes a switched filter, which is variable in band width, and an n pass filter. The n pass filter includes n elements arranged in parallel so as to supply n local oscillating frequencies, and each of the elements is implemented by a series of two frequency converters.

A prior art tuner with built-in PLL circuit is disclosed in Japanese Patent Application 9-266467, which was filed by the applicant identical with the assignee of the present invention. The prior art tuner with built-in PLL circuit is illustrated in FIG. 1 of the drawings. The prior art tuner has a band pass filter 34 outside of a semiconductor substrate 33, and the band pass filter 34 is connected between a mixer 11 and an intermediate frequency amplifier 13. The band pass filter 34 is implemented by an LC circuit, and connected to two output terminals of the mixer 11 so as to vary the tuning frequency.

The prior art tuner with built-in PLL further comprises a data interface 23, a program coupler 16, a reference counter 17, a reference signal generator 18, a phase comparator 19 and a quartz oscillator 31. The quartz oscillator 31 is separated from the semiconductor substrate 33, and is connected to the reference signal generator 18. The quartz oscillator 31 supplies an oscillating signal to the reference signal generator 18. The reference signal generator 18 produces a reference frequency signal from the oscillating signal, and supplies the reference frequency signal to the reference counter 17.

User inputs a piece of control data DA representative of a station to be tuned into the data interface 23. The data interface supplies a piece of control data representative of a dividing ratio and another piece of control data representative of another dividing ratio to the program counter 16 and the reference counter 17, respectively. The reference counter 17 reduces the frequency of the reference frequency signal at the given dividing ratio, and supplies an output signal to the first input node of the phase comparator 19. The program counter 16 reduces the frequency of an input signal at the given dividing ratio, and supplies an output signal to the second input node of the phase comparator 19. The phase comparator 19 produces an output signal representative of the difference in frequency between the output signals.

The prior art tuner with built-in PLL further comprises a charge pump 20, a tuning amplifier 21, a voltage-controlled oscillator 30 and a local oscillator 14, and a prescaler 15. The voltage-controlled oscillator 30 is separated from the semiconductor substrate 33. Thus, the prior art tuner with built-in PLL is broken down into the integrated circuit on the semiconductor substrate, the voltage-controlled oscillator 30, the quartz oscillator 31 and the band pass filter 34. In other words, the four parts are assembled into the prior art tuner.

The output signal of the phase comparator 19 is supplied to the charge pump 20, and charge pump 20 produces an output voltage signal variable with the number of pulses. The change pump 20 supplies the output voltage signal through a tuning amplifier 21 to the voltage-controlled oscillator 30. The voltage controlled oscillator 30 produces an oscillation signal at a frequency proportional to the output voltage signal, and the oscillation signal is supplied through the local oscillator 14 to the mixer 11 and the prescaler 15. The prescaler 15 reduces the frequency of the oscillating signal, and supplies an output signal in a frequency band of the program counter 16. The program counter 16 reduces the output signal of the prescaler 15, and supplies the output signal thereof to the phase comparator 19. Thus, the local oscillator 14, the prescaler 15, the program counter 16, the reference counter 17, the oscillator 18, the phase comparator 19, the charge pump 20, the tuning amplifier 21 and the voltage controlled oscillator 30 form in combination the PLL circuit.

The broadcasting facility standards are different among the major countries. FIG. 2 teaches the telecasting facility standards in Japan, the United States of America, Germany and China. The central frequency and the band width of a channel are standardized to be 58.75 MHz and 6 MHz in Japan, 45, 75 MHz and 6 MHz in the United States of America, 38.9 MHz and 7 MHz in German and 38.0 MHz and 8 MHz in China. The band width is indicative of the frequency difference at 3 dB less than the peak value at the central frequency as shown in FIG. 3.

Moreover, the manufacturer takes the burst characteristics and the voice frequency characteristics into account, and determines the filtering characteristics of the band pass filter 34. The manufacturer tailors the band pass filters 34 to each of the importing countries, and connects the band pass filters to the prior art tuner with built-in PLL. Thus, the prior art tuner requires plural kinds of band pass filter. This results in high production cost due to the complicated management of discrete parts and the time-consuming design work.

SUMMARY OF THE INVENTION

It is therefore an important object of the present invention to provide a tuner, which is low in production cost.

To accomplish the object, the present invention proposes to replace the band pass filter with a variable band pass filter under the control of a data interface.

In accordance with one aspect of the present invention, there is provided a comprising a tuning circuit fabricated on a semiconductor substrate and including a mixer for converting a receiving signal to an intermediate frequency signal, an amplifier and a variable band pass filter connected between the mixer and the amplifier for changing a central frequency of the intermediate frequency signal and a band width for a channel, a phase locked loop including circuit components fabricated on the semiconductor substrate and supplying an oscillation signal synchronous with a reference oscillation signal to the mixer, and a controller responsive to an instruction supplied outside of the semiconductor substrate and supplying control signals representative of the central frequency and the band width to the variable band pass filter.

BRIEF DESCRIPTION OF THE DRAWINGS

The features and advantages of the tuner will be more clearly understood from the following description taken in conjunction with the accompanying drawings in which.

DESCRIPTION OF THE PREFERRED EMBODIMENT

Figure 4:
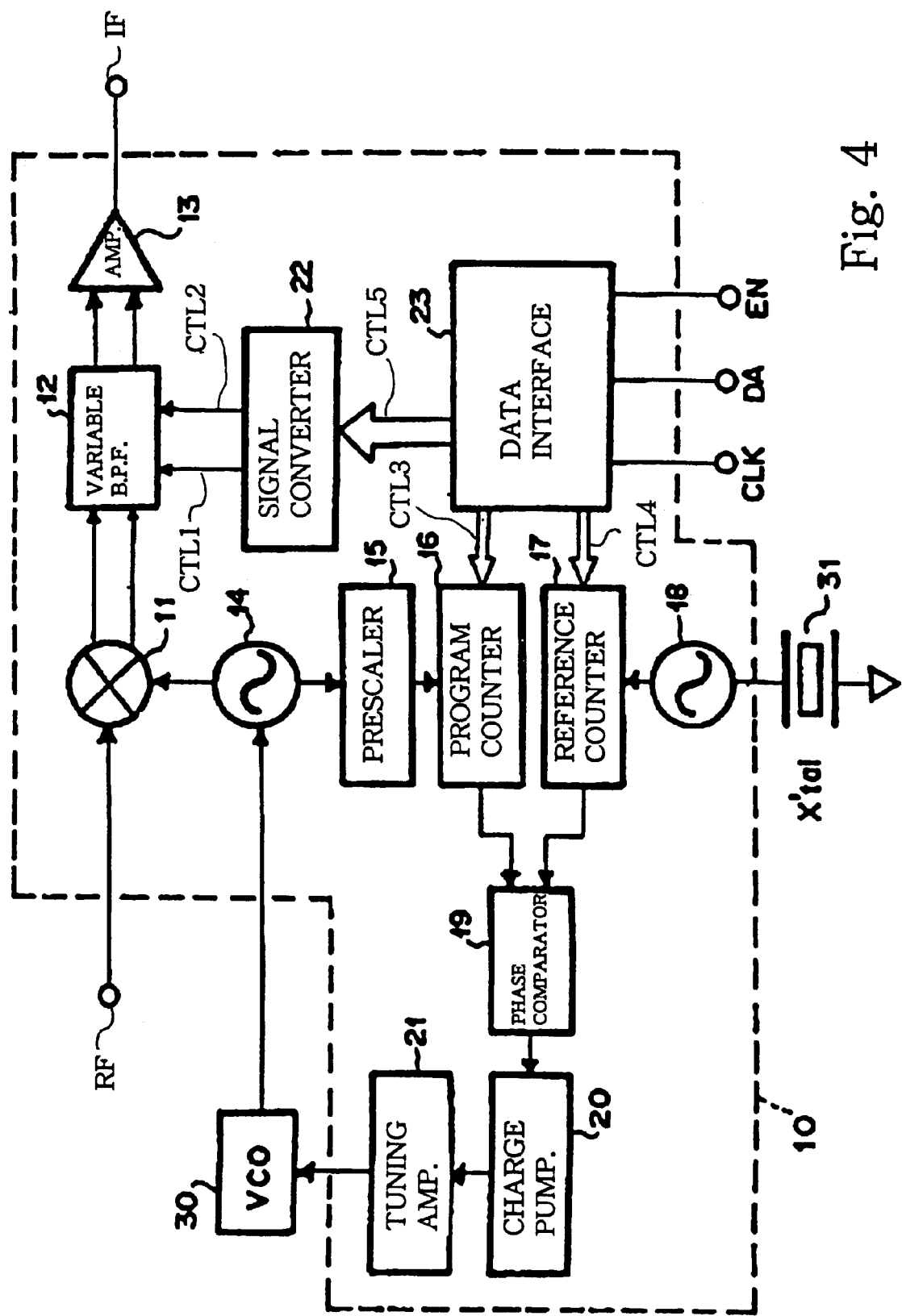
FIG. 4 is a block diagram showing the circuit configuration of a tuner with built-in phase locked loop according to the present invention.

Referring to FIG. 4 of the drawings, a tuner with built-in PLL embodying the present invention largely comprises an integrated circuit 10 fabricated on a semiconductor substrate, a voltage-controlled oscillator 30 and a crystal oscillator 31. However, a band pass filter is integrated on the semiconductor substrate as will be described hereinlater in detail. Any external band pass filter is not required for the tuner according to the present invention. The integrated circuit 10 is shared between the products of the tuner exported to different countries.

The integrated circuit is broken down into an analog tuning circuit, a phase locked loop and a controller. The analog tuning circuit is connected between a signal input terminal RF and a signal output terminal IF, and a receiving signal is supplied to the signal input terminal RF. The phase locked loop supplies an oscillation signal to the analog tuning circuit, and the receiving signal is mixed with the oscillation signal for producing an intermediate frequency output signal. The intermediate frequency output signal is taken out from the signal output terminal IF. Though not shown in FIG. 4, the intermediate frequency output signal is usually supplied through an intermediate frequency amplifier to a demodulation detector. The demodulation detector converts the intermediate frequency output signal to a base band signal.

The analog tuning circuit includes a mixer 11, a variable band pass filter 12, an intermediate frequency amplifier 13 and a local oscillator 14. The mixer 11, the variable band pass filter 12 and the intermediate frequency amplifier 13 are connected in series between the signal input terminal RF and the signal output terminal IF, and the local oscillator 14 generates the oscillation signal. The crystal oscillator 31 supplies a basic oscillation signal to the phase locked loop, and the phase locked loop makes the frequency of the oscillation signal proportional to the frequency of a reference oscillation signal produced from the basic oscillation signal. The variable band pass filter 12 is responsive to control signals CTL1/CTL2 from the controller so as to vary the central frequency and the band width. The variable band pass filter 12 is, by way of example, implemented by an LCR circuit or an active filter.

Figure 5:
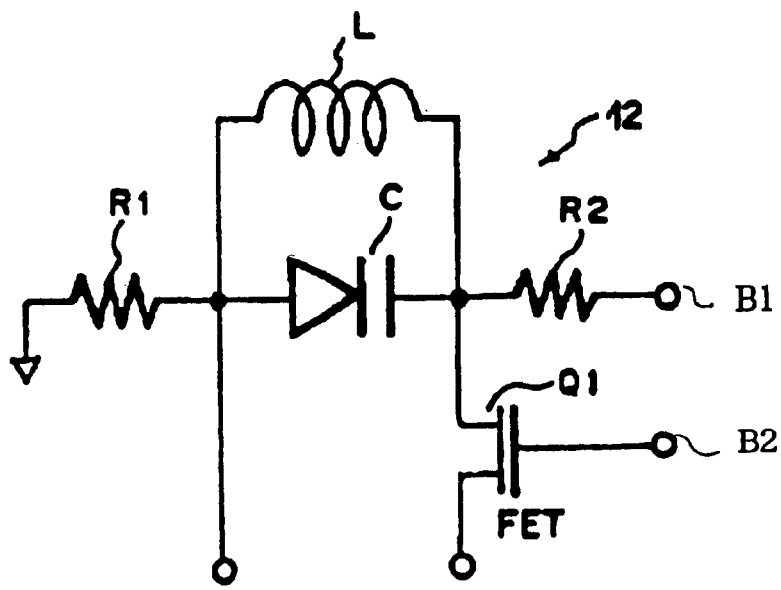
FIG. 5 is a circuit diagram showing the circuit configuration of a variable band pass filter incorporated available for the tuner.

FIG. 5 illustrates an example of the LCR circuit serving as the variable band pass filter 12. The LCR circuit includes a resistor R1, an inductor L, a varactor diode C, a resistor R2 and a field effect transistor Q1. The resistor R1 is serially connected to an input node assigned to the intermediate frequency signal. The inductor L and the varactor diode C are connected in parallel between the resistor R1 and the other resistor R2. The varactor diode C serves as a variable capacitor. One of the control signals CTL1 is supplied to a control node B1, and is applied through the resistor R2 to the output node. The other of the control signals CTL2 is supplied through a control node B2 to the gate electrode of the field effect transistor Q1. The field effect transistor Q1 varies the channel resistance depending upon the magnitude of the other control signal CTL2, and, accordingly, serves as a variable resistor. The center frequency and the band width of the variable band pass filter 12 is dependent on the control signals CTL1/CTL2 applied to the varactor diode C and the gate electrode of the field effect transistor Q1.

Figure 6:
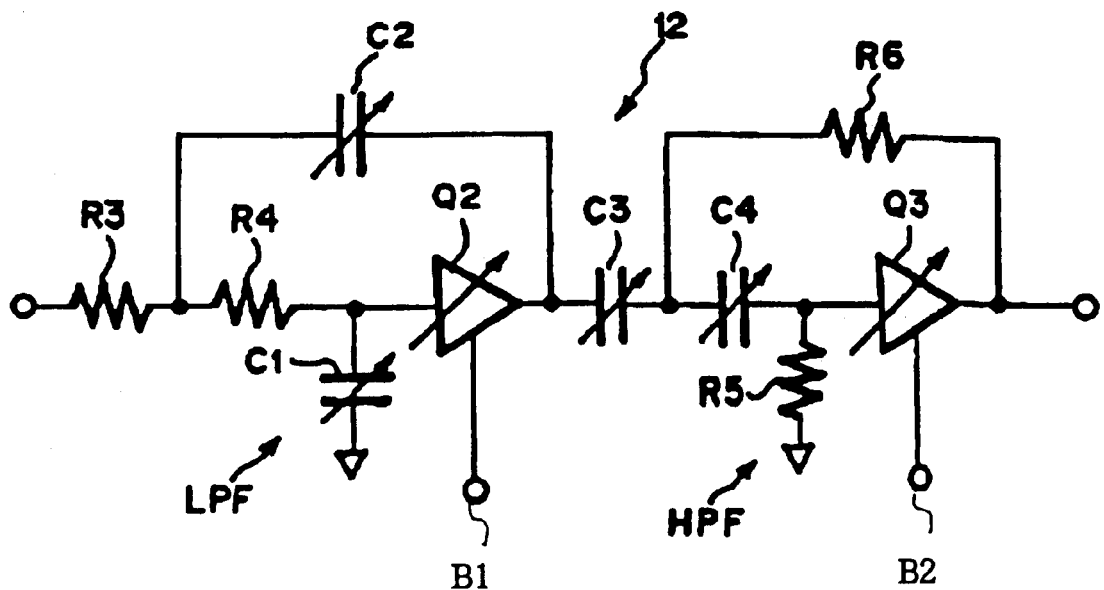
FIG. 6 is a circuit diagram showing the circuit configuration of another variable band pass filter available for the tuner.

FIG. 6 illustrates an example of the active filter serving as the variable band pass filter 12. The active filter includes a low pass filter LPF and a high pass filter HPF connected in series, and a varactor diode C3 is connected between the low pass filter LPF and the high pass filter HPF.

The low pass filter LPF includes a series resistor R3, a matching resistor R4, a varactor diode C1, an operational amplifier Q2 and a feedback varactor diode C2. The series resistor R3, the matching resistor R4 and the operational amplifier Q2 are connected in series, and the varactor diode C2 provides a feedback path from the output node of the operational amplifier Q2 to the node between the resisters R3 and R4. The other varactor diode C1 is connected between the input node of the operational amplifier Q2 and the ground. The control node B1 of the operational amplifier Q2 is biased with one of the control signals CTL1, and the operational amplifier Q2 varies the gain thereof depending upon the magnitude of the control signal CTL1.

The high pass filter HPF includes a series varactor diode C4, a resistor RS, an operational amplifier Q3 and a feedback resistor R6. The varactor diode C4 and the operational amplifier Q3 are connected in series, and the feedback resistor R6 is connected from the output node of the operational amplifier Q3 to the node between the varactor diodes C3 and C4. The resistor R5 is connected between the input node of the operational amplifier Q3 and the ground. The control node B2 of the operational amplifier Q3 is biased with the other of the control signals CTL2, and the operational amplifier varies the gain thereof depending upon the magnitude of the other control signal CTL2.

The varactor diodes C1 to C4 serve as variable capacitors, and the active filter 12 varies the center frequency and the band width depending upon the gains of the operational amplifiers Q2 and Q3. In other words, the center frequency and the band width are variable together with the magnitude of the control signals CTL1/CTL2.

In detail, the operational amplifier Q2 changes the gain depending upon the control signal CTL1, and the varactor diodes C1, C2 and C3 respectively vary the values of the capacitance depending upon the input/output signals of the operational amplifier Q2. As a result, the central frequency and the band width are varied together with the values of the capacitance. Thus, the low pass filter LPF varies the pass band depending upon the control signals CTL1/CTL2. Similarly, the operational amplifier Q3 changes the gain depending upon the control signal CTL2, and the varactor diode C4 varies the value of the capacitance together with the output signal of the operational amplifier Q3. As a result, the high pass filter HPF varies the pass band. Thus, the low pass filter LPF cooperates with the high pass filter HPF so as to vary the central frequency and the band width of the band pass filter 12.

Turning back to FIG. 4 of the drawings, the phase locked loop includes the voltage controlled oscillator 30, the local oscillator 14, a prescaler 15, a program counter 16, a reference counter 17, a crystal oscillator 18, a phase comparator 19, a charge pump 20 and a tuning amplifier 21. The local oscillator 14 is shared between the analog tuning circuit and the phase locked loop.

The crystal oscillator 31 supplies the basic oscillation signal to the crystal oscillator 18, and the crystal oscillator 18 produces the reference oscillation signal from the basic oscillation signal. The program counter 16 and the reference counter 17 serve as frequency dividers, and the controller instructs the program counter 16 and the reference counter 17 the dividing ratio through control signals CTL3/CTL4.

The reference counter 17 divides the frequency of the reference oscillation signal by the given dividing ratio, and supplies a low frequency output signal to the input node of the phase comparator 19. Similarly, the program counter 16 divides the frequency of an oscillation signal from the prescaler 15 by the given ratio, and supplies another low frequency output signal to the other input node of the phase comparator 19.

The phase comparator 19 compares the low frequency output signal from the program counter 16 with the low frequency output signal from the reference counter. 17 to see whether or not any frequency difference takes place between the low frequency output signals, and produces an output signal representative of the phase difference or the magnitude of the frequency difference. The phase comparator 19 supplies the output signal to the charge pump 20, and the change pump 20 varies the potential level of an output signal thereof depending upon the output signal of the phase comparator 19. Thus, the output signal of the charge pump 20 is also representative of the phase difference. The charge pump 20 supplies the output voltage signal through the tuning amplifier 21 to the voltage controlled oscillator 30. The voltage controlled oscillator 30 includes a varactor diode, a parallel capacitor and a resonant coil, and is responsive to a voltage control signal so as to vary the oscillation frequency. The tuning amplifier 21 changes the output voltage signal to the voltage control signal appropriate to the varactor diode incorporated in the voltage controlled oscillator 30. The voltage controlled oscillator 30 varies the frequency of the output signal depending upon the potential level of the magnitude of the voltage control signal, and supplies the output signal to the local oscillator 14. The local oscillator 14 produces the oscillation signal on the basis of the output signal of the voltage controlled oscillator 30, and supplies the oscillation signal to both of the mixer 11 and the prescaler 15. The local oscillator 14 is a kind of transistor circuit fabricated on the semiconductor substrate, and the voltage controlled oscillator 30 is the resonant circuit connected to the transistor circuit. The resonant circuit has the varactor diode and the coil. The varactor diode serves as a variable capacitor. The control voltage signal is supplied from the tuning amplifier 21 to the varactor diode, and the oscillation frequency is varied with the control voltage signal. The voltage controlled oscillator 30 and the local oscillator 14 as a whole constitute an oscillation circuit, and the voltage controlled oscillator 30 and the local oscillator 14 represent the parts of the oscillation circuit outside of the semiconductor substrate and the other parts of the oscillation circuit fabricated on the semiconductor substrate. Thus, the phase locked loop is similar in function to the phase locked loop of the prior art tuner.

The controller includes a data interface 23 and a signal converter 22. A clock terminal CLK, a data terminal DA and a control terminal EN are connected to the data interface 23, and a clock signal, a digital data signal and an enable signal are supplied to the clock terminal CLK, the data terminal DA and the control terminal EN, respectively. The digital data signal DA gives the data interface 23 pieces of data information representative of a selected station, and the data interface 23 produces the control signals CTL3 to CTL5. The control signals CTL3, CTL4 and CTL5 are supplied to the program counter 16, the reference counter 17 and the signal converter 22, respectively. The signal converter 22 has a digital-to-analog converter. The control signal CTL5 is in the form of binary code, and is supplied to the digital-to-analog converter. The digital-to-analog converter converts the control signal CTL5 to the control signals CTL1/

CTL2. As described hereinbefore, the band pass filter 12 varies the central frequency and the band width depending upon the control signals CTL1/CTL2. On the other hand, the control signals CTL3/CTL4 CTL4 are indicative of the dividing ratio to the program counter 16 and the dividing ratio to the reference counter 17. The reference counter 17 varies the frequency of the output signal thereof depending upon the control signal CTL4, and the program counter 16 similarly varies the frequency of the output signal in such a manner that the phase comparator 19 can compare the output signal with the output signal of the reference counter 17.

Figure 1:
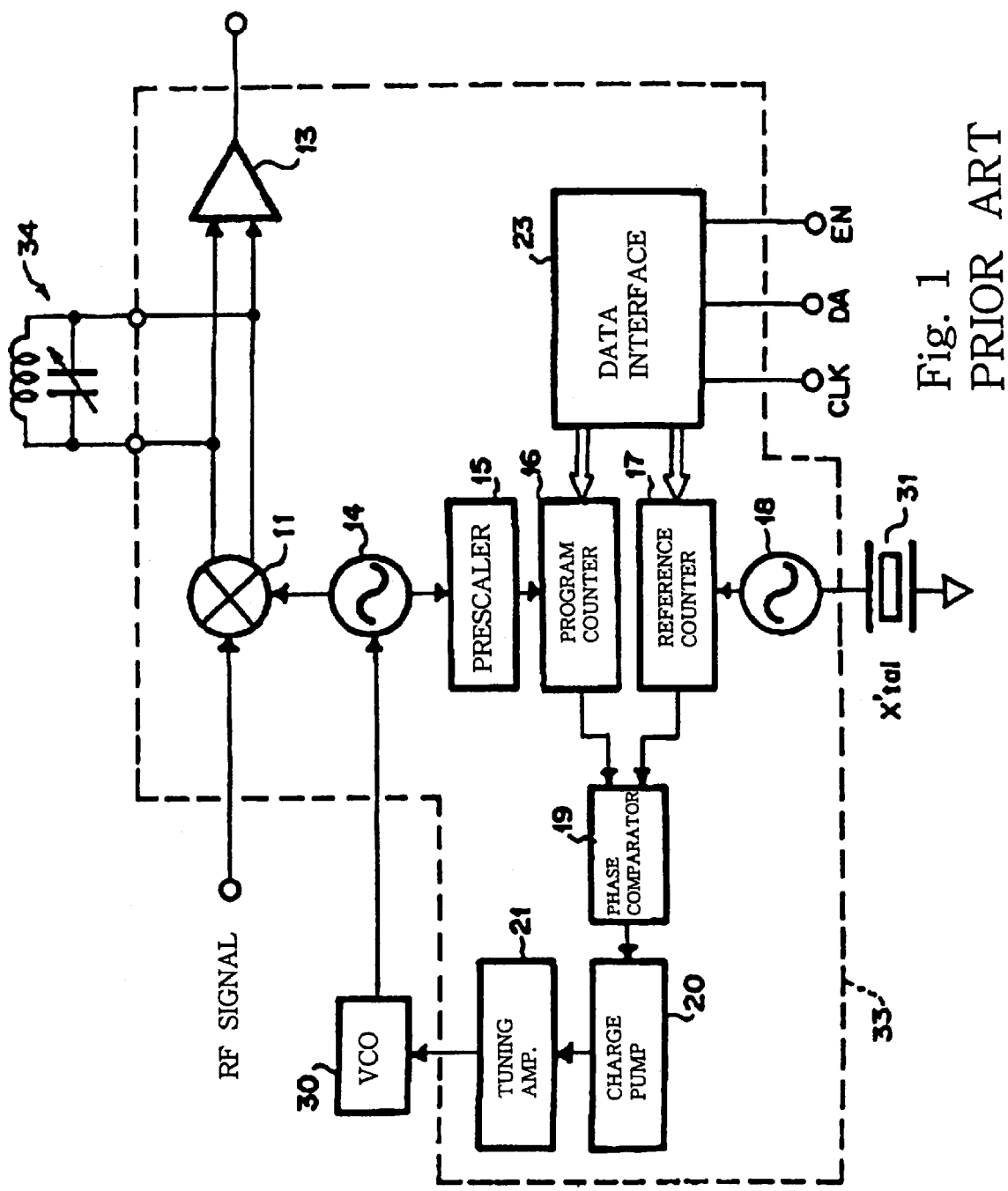
FIG. 1 is a block diagram showing the circuit configuration of the prior art tuning circuit with built-in PLL disclosed in Japanese Patent Application No. 9-266467.
Figures 2, 3:
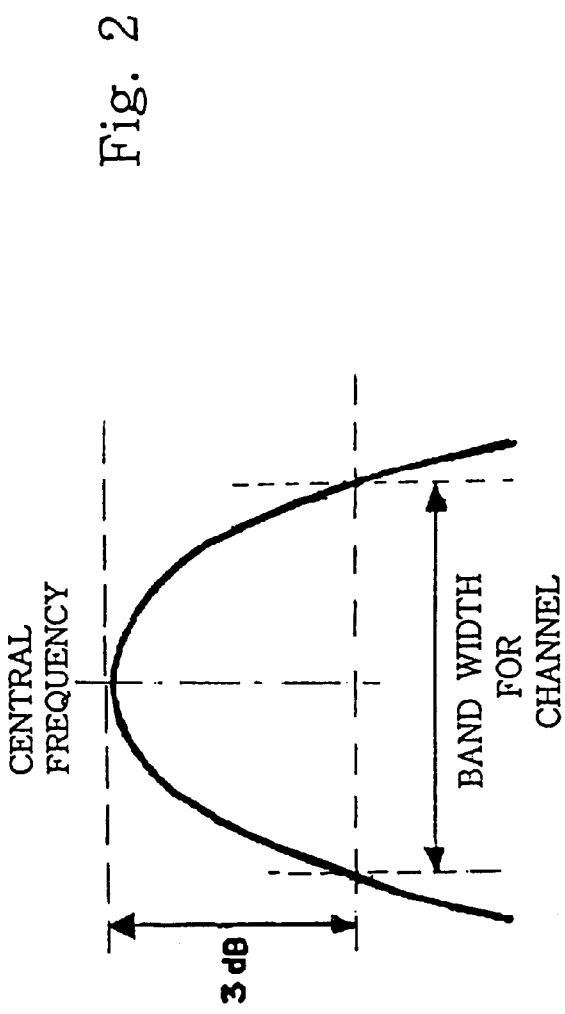
FIG. 2 is a view showing the telecasting facility standards in the major countries.
FIG. 3 is a graph showing the relation between the intermediate frequency and the band width for channels.

FIG. 2 shows the relation between the data signal and the telecasting facility standards in several countries. When the band pass filter 12 is adjusted to the telecasting facility standards in Japan, data fields of the data signal DA assigned to the central frequency and the band width for the channel are regulated to "00" and "00", respectively. Then, the band pass filter 12 adjusts the central frequency and the band width to 58.75 MHz and 6 MHz, respectively. On the other hand, when the band pass filter 12 is adjusted to the telecasting facility standards in the United States of America, the data fields are regulated to "01" and "00", respectively. Then, the band pass filter 12 adjusts the central frequency and the band width for the channel to 45.75 MHz and 6 MHz, respectively. If the band pass filter 12 is to be adjusted to the telecasting facility standards in other countries, the data fields are regulated as shown in FIG. 2.

As will be appreciated from the foregoing description, the data interface 23 causes the signal converter 22 to supply the control signals CTL1/CTL2 on the basis of the digital data signal DA, and the band pass filter 12 changes the central frequency and the band width of the channel to the values defined in the telecasting facility standards in an imported country. In other words, all the parts, i.e., the crystal oscillator 31, the voltage controlled oscillator 30 and the integrated circuit fabricated on the semiconductor substrate are shareable between all the imported countries. This results in enhancement of the productivity, and the production cost is lowered.

Although a particular embodiment of the present invention has been shown and described, it will be apparent to those skilled in the art that various changes and modifications may be made without departing from the spirit and scope of the present invention.

What is claimed is:

1. A tuner comprising
    a tuning circuit fabricated on a semiconductor substrate and including a mixer for converting a receiving signal to an intermediate frequency signal, an amplifier and a variable band pass filter connected between said mixer and said amplifier for changing a central frequency of said intermediate frequency signal and a band width for a channel,
    a phase locked loop including circuit components fabricated on said semiconductor substrate and supplying an oscillation signal synchronous with a reference oscillation signal to said mixer, and
    a controller responsive to an instruction supplied outside of said semi-conductor substrate and supplying control signals representative of said central frequency and said band width to said variable band pass filter.

2. The tuner as set forth in claim 1, in which said controller includes
    a data interface supplied with said instruction and producing a digital control signal, and
    a signal converter having a digital-to-analog converter for converting said digital control signal to said control signals varied in potential level.

3. The tuner as set forth in claim 1, in which said variable band pass filter is an LCR circuit.

4. The tuner as set forth in claim 3, in which said LCR circuit includes
    a parallel combination of a variable capacitor and an inductor connected between an input node and an output node,
    a first resistor connected between said input node and a constant voltage source,
    a second resistor connected to said output node and supplying one of said control signals, and
    a variable resistor connected between said variable capacitor and said output node and responsive to another of said control signals so as to change the resistance thereof.

5. The tuner as set forth in claim 4, in which a varactor diode serves as said variable capacitor.

6. The tuner as set forth in claim 4, in which a field effect transistor serves as said variable resistor, and said another of said control signals is supplied to a gate electrode of said field effect transistor.

7. The tuner as set forth in claim 1, in which an active filter serves as said variable band pass filter.

8. The tuner as set forth in claim 7, in which said active filter includes a variable low pass filter, a variable high pass filter and a coupling varactor diode connected between said low pass filter and said high pass filter.

9. The tuner as set forth in claim 8, in which said variable low pass filter includes
    a serial resistor connected to an input node,
    a matching resistor connected to said serial resistor,
    another varactor diode connected between said matching resistor and a constant voltage source,
    an operational amplifier connected between said matching resistor and said varactor diode and responsive to one of said control signals so as to vary a gain thereof, and
    a feedback varactor diode connected between an output node of said operational amplifier and a node between said serial resistor and said matching resistor.

10. The tuner as set forth in claim 8, in which said variable high pass filter includes
    another varactor diode connected to said varactor diode,
    a resistor connected to said another varactor diode and a constant voltage source,
    an operational amplifier connected between said another varactor diode and an output node and responsive to one of said control signals so as to vary a gain thereof, and
    a feedback resistor connected between an output node of said operational amplifier and a node between said varactor diode and said another varactor diode.

11. The tuner as set forth in claim 1, in which said phase locked loop includes a program counter serving as a frequency divider and responsive to another control signal so as to change a frequency dividing ratio and a reference counter serving as another frequency divider and responsive to yet another control signal so as to change a frequency dividing ratio, and
    said controller further produces said another control signal and said yet another control signal.

* * * * *